(12) United States Patent
Kim

(10) Patent No.: US 8,472,241 B2
(45) Date of Patent: Jun. 25, 2013

(54) PHASE CHANGE RANDOM ACCESS MEMORY DEVICE

(75) Inventor: Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 132 days.

(21) Appl. No.: 13/217,362

(22) Filed: Aug. 25, 2011

(65) Prior Publication Data

US 2012/0081955 A1     Apr. 5, 2012

(30) Foreign Application Priority Data

Sep. 30, 2010  (KR) ........................ 10-2010-0095670

(51) Int. Cl.
 *G11C 11/00*  (2006.01)
(52) U.S. Cl.
 USPC ....... 365/163; 365/148; 365/207; 365/189.09
(58) Field of Classification Search
 USPC ................... 365/163, 148, 207, 205, 189.09
 See application file for complete search history.

(56) References Cited

U.S. PATENT DOCUMENTS 8,130,539 B2 * 3/2012 Yoon ........................... 365/163

FOREIGN PATENT DOCUMENTS

| KR | 1020010004688 A | 1/2001 |
| KR | 100351594 B1 | 8/2002 |
| KR | 1020080086243 A | 9/2008 |
| KR | 1020090056284 A | 6/2009 |

* cited by examiner

*Primary Examiner* — David Lam
(74) *Attorney, Agent, or Firm* — William Park & Associates Patent Ltd.

(57) ABSTRACT

A phase change random access memory device includes: a sense amplifier driving unit configured to compare an input voltage applied through an input signal line with a reference voltage and amplify an output signal in response to the comparison result; an input unit configured to receive an input signal from the input signal line and transmit the received signal to the sense amplifier driving unit; and a coupling prevention unit including a plurality of MOS transistors sharing a bulk bias, coupled between the sense amplifier driving unit and the input unit, and configured to control a sensing margin in response to a level of the input signal.

19 Claims, 8 Drawing Sheets

PHASE CHANGE RANDOM ACCESS MEMORY DEVICE

CROSS-REFERENCES TO RELATED APPLICATION

The present application claims priority under 35 U.S.C. §119(a) to Korean application number 10-2010-0095670, filed on Sep. 30, 2010, in the Korean Intellectual Property Office, which is incorporated herein by reference in its entirety.

BACKGROUND

1. Technical Field

The present invention relates generally to a phase change random access memory device, and more particularly, to a phase change random access memory device including sense amplifier groups.

2. Related Art

In general, the data processing speeds of the nonvolatile memories such as the magnetic memory or the phase change random access memory (PCRAM) that retain data even when power is cut off are comparable to the data processing speeds of the volatile random access memory (RAM).

FIG. 1 is a circuit diagram of a conventional phase change random access memory device.

Referring to FIG. 1, the conventional phase change random access memory device 50 includes a plurality of sense amplifier groups 10, 20, and 30.

The plurality of sense amplifier groups 10, 20, and 30 typically correspond one-to-one to the first to third sense amplifier drivers 12, 22, and 32, respectively. When an external sense amplifier enable signal en is enabled to notice an operation time of sense amplifiers, the corresponding sense amplifier driver 12, 22, or 32 of the selected cell block is driven.

The first sense amplifier group 10 includes a first coupling prevention unit 14 and a first input unit 16. The first coupling prevention unit 14 is configured to prevent a first input signal in0 applied from outside from being distorted by coupling. The first input unit 16 is configured to output the first input signal in0 applied from an input voltage terminal to the first sense amplifier driver 12, in response to the level of the enable signal en.

The second and third sense amplifier groups 20 and 30 also include second and third coupling prevention units 24 and 34, respectively, and second and third input units 26 and 36, respectively. The second and third sense amplifier groups 20 and 30 are configured in the same manner as the first sense amplifier group 10 as described above.

The first coupling prevention unit 14 includes, for example, a MOS capacitor T1. The gate of the MOS capacitor T1 is electrically coupled to an enable signal line 44, and a source/drain of the MOS capacitor T1 is coupled to an input signal line 42.

As such, the MOS capacitors T1, T2, and T3 of the respective coupling prevention units 14, 24, and 34 are electrically coupled to the input signal line 42 and individually receive different voltage signals from each other.

FIGS. 2 and 3 illustrate the layout structure of the first to third coupling prevention units 14, 24, and 34 of the conventional phase change random access memory device. Referring to FIGS. 2 and 3, impurities are implanted into the regions of a semiconductor substrate 55, on which the first to third coupling prevention units 14, 24, and 34 are to be formed, thereby forming a plurality of active regions 54a, 54b, and 54c.

In this case, however, a barrier rib (not illustrated) should be formed between the respective active regions 54a, 54b, and 54c, or the first to third coupling prevention units 14, 24, and 34 should be spaced at even intervals P1 and P2 from each other, in order to discriminate the active regions from each other. Therefore, there is a limit in reducing the entire size of the phase change random access memory device.

SUMMARY

In an embodiment of the present invention, a phase change random access memory device includes: a sense amplifier driving unit configured to compare an input voltage applied through an input signal line with a reference voltage and amplify an output signal in response to the comparison result; an input unit configured to receive an input signal from the input signal line and transmit the received signal to the sense amplifier driving unit; and a coupling prevention unit including a plurality of MOS transistors sharing a bulk bias, coupled between the sense amplifier driving unit and the input unit, and configured to control a sensing margin in response to a level of the input signal.

Further, according to an embodiment of the present invention, there is provided a phase change random access memory device including a plurality of sense amplifier groups configured to compare an input voltage applied from outside with a reference voltage in response to an applied sense amplifier enable signal and amplify output signals in response to the comparison result, during a sense amplification operation. The plurality of sense amplifier groups include coupling prevention units, respectively, sharing a bulk bias and configured to control a sensing margin in response to the input voltage.

Yet further, in an embodiment of the present invention, a phase change random access memory device includes: a semiconductor substrate into which impurities are implanted to define one active region; a plurality of transistors having source/drain regions which are commonly coupled over the one active region and arranged in a line; and an enable signal line electrically coupled to sources/drains of the transistors.

In an embodiment of the present invention, there is provided a phase change random access memory device including first to third coupling prevention units configured to control a sensing margin in response to a level of an input signal applied from outside, during a sense amplification operation. The first to third coupling prevention units are formed in a line over a semiconductor substrate having one P well, and electrically coupled to a sense amplifier enable signal line through a plurality of contact holes, respectively.

BRIEF DESCRIPTION OF THE DRAWINGS

Features, aspects, and embodiments are described in conjunction with the attached drawings, in which.

DETAILED DESCRIPTION

Figure 4:
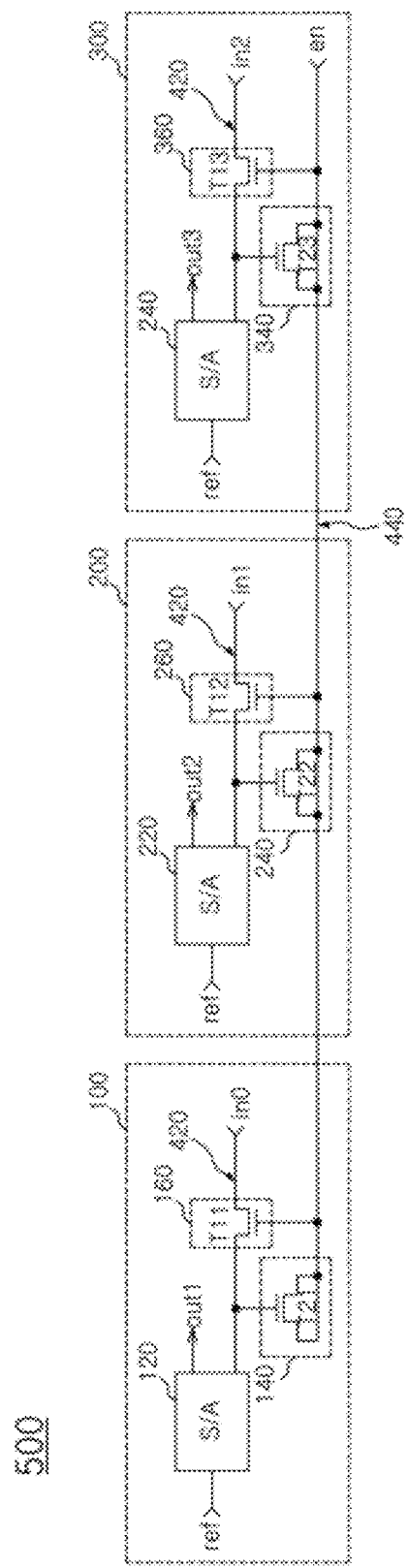
FIG. 4 is a circuit diagram of a phase change random access memory device according to an embodiment of the present invention.

Hereinafter, a phase change random access memory device according to exemplary embodiments of the present invention will be described below with reference to the accompanying drawings FIG. 4 is a circuit diagram of a phase change random access memory device according to an embodiment of the present invention.

Referring to FIG. 4, the phase change random access memory device 500 according to an embodiment includes a plurality of sense amplifier groups 100, 200, and 300.

The plurality of sense amplifier groups 100, 200, and 300 include first to third sense amplifier drivers 120, 220, and 320 formed therein, respectively.

The plurality of sense amplifier groups 100, 200, and 300 receive a sense amplifier enable signal en for noticing an operation time of the sense amplifiers from outside. When the sense amplifier enable signal en is enabled, a corresponding sense amplifier driver of a selected cell block is driven.

The first sense amplifier driver 120 is configured to receive a first input signal in0 having a first level from outside, compare the received first input signal in0 with a reference voltage ref, and generate, amplify, and output a first output signal out1 in response to the comparison result.

The second sense amplifier driver 220 is configured to receive a second input signal in1 having a second level from outside, compare the received second input signal in1 with the reference voltage ref, and generate, amplify, and output a second output signal out2 in response to the comparison result.

The third sense amplifier driver 320 is configured to receive a third input signal in2 having a third level from outside, compare the received third input signal in2 with the reference voltage ref, and generate, amplify, and output a third output signal out2 in response to the comparison result.

The first to third levels of the first to third input signals described in an embodiment of the present invention may be of the magnitudes that are different from each other.

A power supply voltage VDD and a ground voltage VSS are provided as the sense amplifier bias voltages of the first to third sense amplifier groups 120, 220, and 320. When the first to third sense amplifier groups 120, 220, and 320 start an operation, a bit line pair BL and BL/ having maintained a minute potential difference transitions to a large potential difference. Then, a column decoder (not illustrated) selected by a column address turns on a column transmission transistor for transmitting data of the bit line to a data bus line. Accordingly, the data of the bit line pair is transmitted to the data bus line and outputted to the outside of the device.

The first sense amplifier group 100 includes a first coupling prevention unit 140 and a first input unit 160. The first coupling prevention unit 140 is configured to prevent the first input signal in0 applied from outside from being distorted by coupling. The first input unit 160 is configured to output the first input signal in0 applied from an input voltage terminal to the first sense amplifier driver 120, in response to the level of the enable signal en.

The second sense amplifier group 200 includes a second coupling prevention unit 240 and a second input unit 260. The second coupling prevention unit 240 is configured to prevent the second input signal in1 applied from outside from being distorted by coupling. The second input unit 260 is configured to output the second input signal in1 applied from an input voltage terminal to the second sense amplifier driver 220, in response to the level of the enable signal en.

The third sense amplifier group 300 includes a third coupling prevention unit 340 and a third input unit 360. The third coupling prevention unit 340 is configured to prevent the third input signal in2 applied from outside from being distorted by coupling. The third input unit 360 is configured to output the third input signal in2 applied from an input voltage terminal to the third sense amplifier driver 320, in response to the level of the enable signal en.

The first to third coupling prevention units 140, 240, and 340 include, for example, first to third MOS capacitors T21, T22, and T23, respectively. The gates of the first to third MOS capacitors T21, T22, and T23 are electrically coupled to an input signal line 420, and the sources/drains of the first to third MOS capacitors T21, T22, and T23 are electrically coupled to an enable signal line 440.

The first to third input units 160, 260, and 360 are coupled between the first, second, and third coupling prevention units 140, 240, and 340 and the input voltage terminal, respectively, and may include, for example, the fourth to sixth NMOS transistors T11, T12, and T13, respectively. The gates of the fourth to sixth NMOS transistors T11 to T13 are electrically coupled to the enable signal line 440, and the sources/drains of the fourth to sixth NMOS transistors T11 to T13 are electrically coupled to the input signal line 420.

As such, in the phase change random access memory device 500 according to an embodiment of the present invention, the sources/drains of the first to third MOS transistors T21, T22, and T23 of the first to third coupling prevention units 100, 200, and 300 may be coupled to the enable signal line 440. Accordingly, the first to third coupling prevention units 140, 240, 340 according to an embodiment may share a bulk bias voltage by coupling the sources/drains of the first to third MOS transistors T21, T22, and T23, respectively, to the nodes of the enable signal line 440, which cause coupling. Therefore, coupling noise that may occur during a sense amplification operation can be removed, and it can therefore improve the sensing margin.

Figure 5:
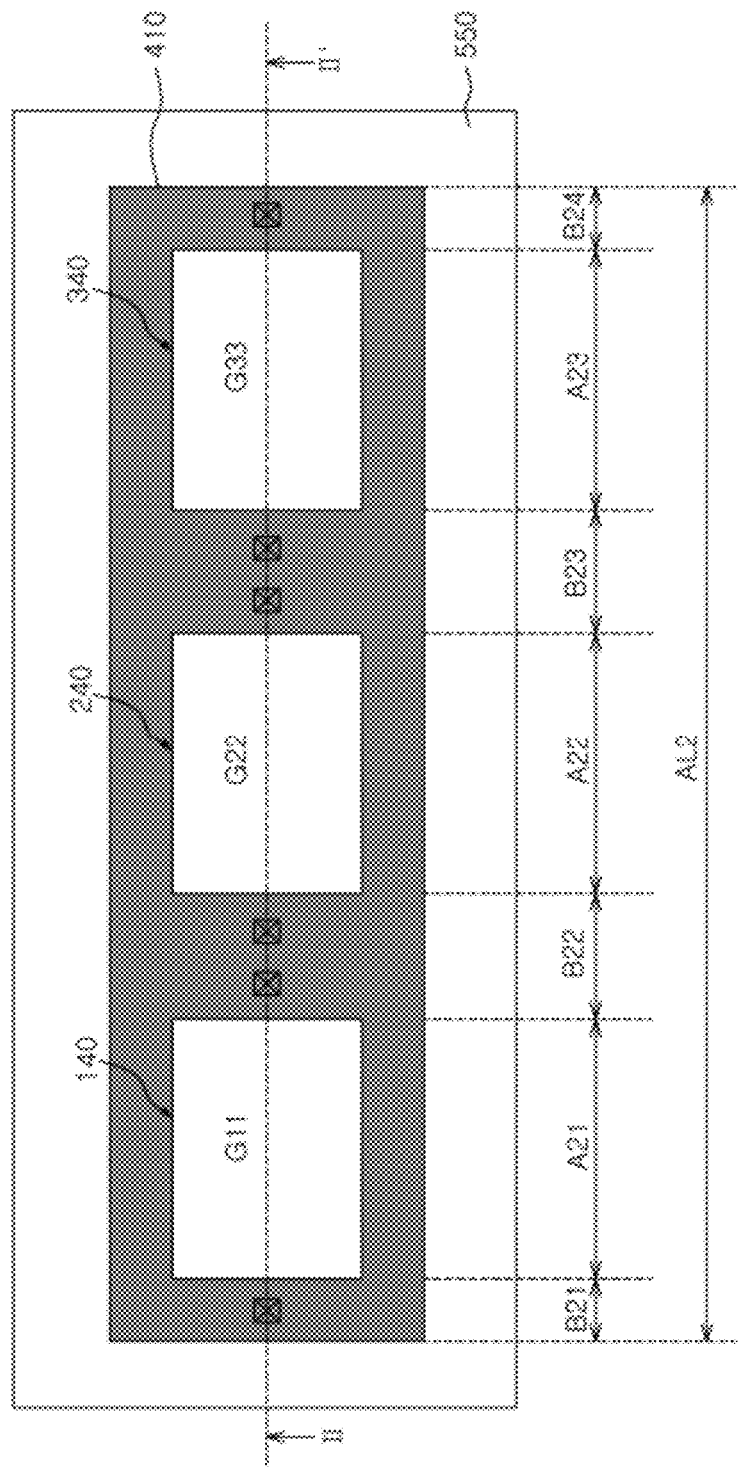
FIG. 5 is a plan view of the phase change random access memory device according to an embodiment of the present invention.
Figure 6:
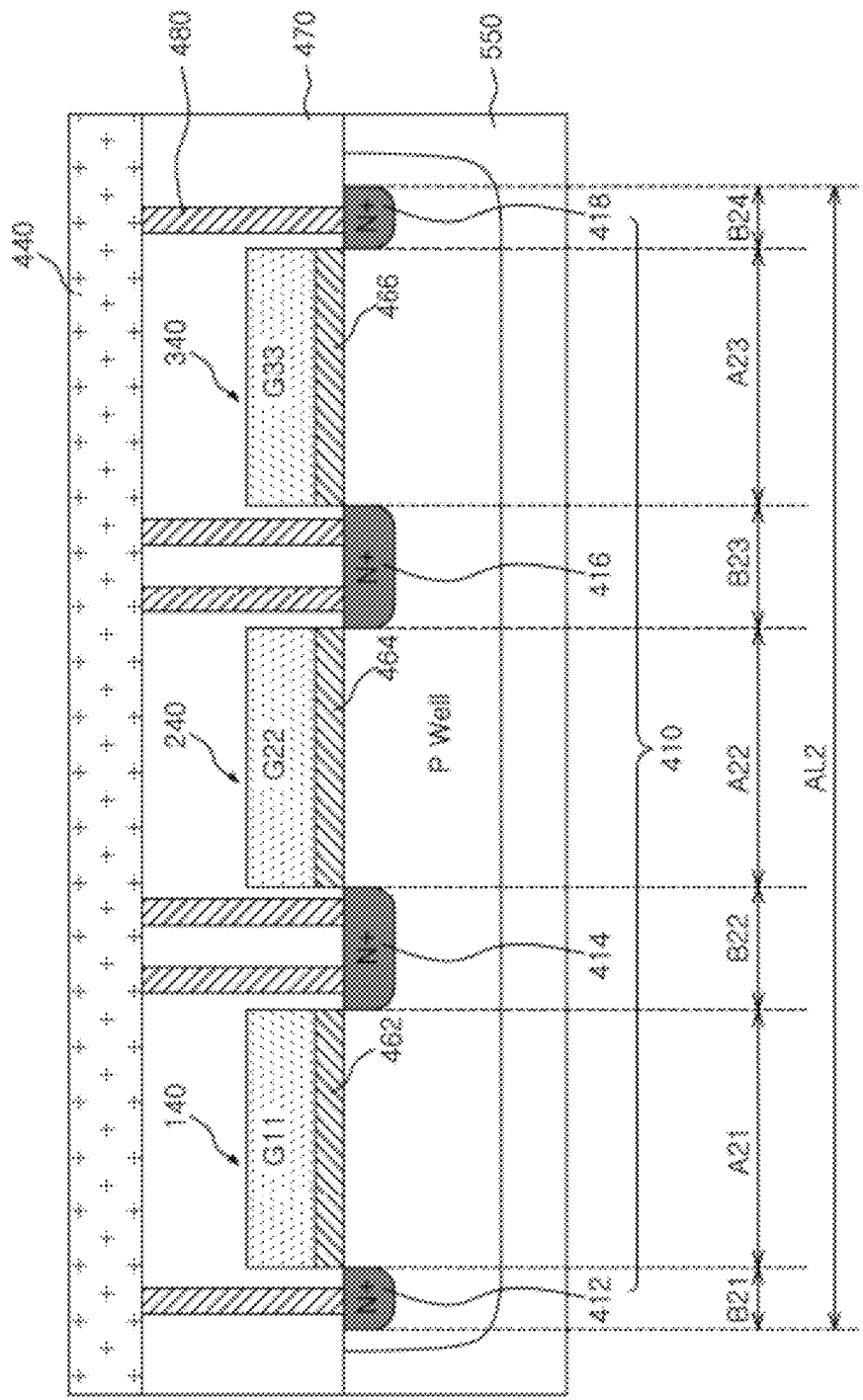
FIG. 6 is a cross-sectional view of the phase change random access memory device, taken along a line II-II' of FIG. 5.

FIG. 5 is a plan view of the phase change random access memory device according to an embodiment. FIG. 6 is a cross-sectional view of the phase change random access memory device of FIG. 5, taken along a line II-II'.

More specifically, FIGS. 5 and 6 are plan and cross-sectional views illustrating only the layout structures of the first to third coupling prevention units 140, 240, 340 in the phase change random access memory device 500 of FIG. 4.

Referring to FIGS. 5 and 6, the phase change random access memory device 500 according to an embodiment includes the first to third coupling prevention units 140, 240, and 340 arranged in a line over a P-well semiconductor substrate 550.

More specifically, the first coupling prevention unit 140 is formed at one side of the P-well semiconductor substrate 550, and includes a first gate G11. The second coupling prevention unit 240 is formed in the middle of the P-well semiconductor substrate 550, and includes a second gate G22. The third coupling prevention unit 340 is formed at the other side of the P-well semiconductor substrate 550, and includes a third gate G33.

The first to third gates G11, G22, G33 are formed to have first to third lengths A21, A22, A23, respectively, which are equal to one another, and the first to third gates G11, G22, G33 are spaced at even intervals from each other.

Referring to FIG. 6, impurities are implanted outside the first and third gates G11 and G33 to form first and fourth source/drain regions 412 and 418, respectively, and the impurities are implanted between the first and second gates G11 and G22 and between the second and third gates G22 and G33 to form second and third source/drain regions 414 and 416, respectively.

The second source/drain region 414 can commonly couple the drain of the first coupling prevention unit 140 and the source of the second coupling prevention unit 240, and the third source/drain region 416 can commonly couple the drain of the second coupling prevention unit 240 and the source of the third coupling prevention unit 340.

Therefore, referring back to FIG. 5, the lengths B22 and B23 of the second and third source/drain regions 414 and 416 may be set to be larger than the lengths B21 and B24 of the first and fourth source/drain regions 412 and 418.

Figure 7:
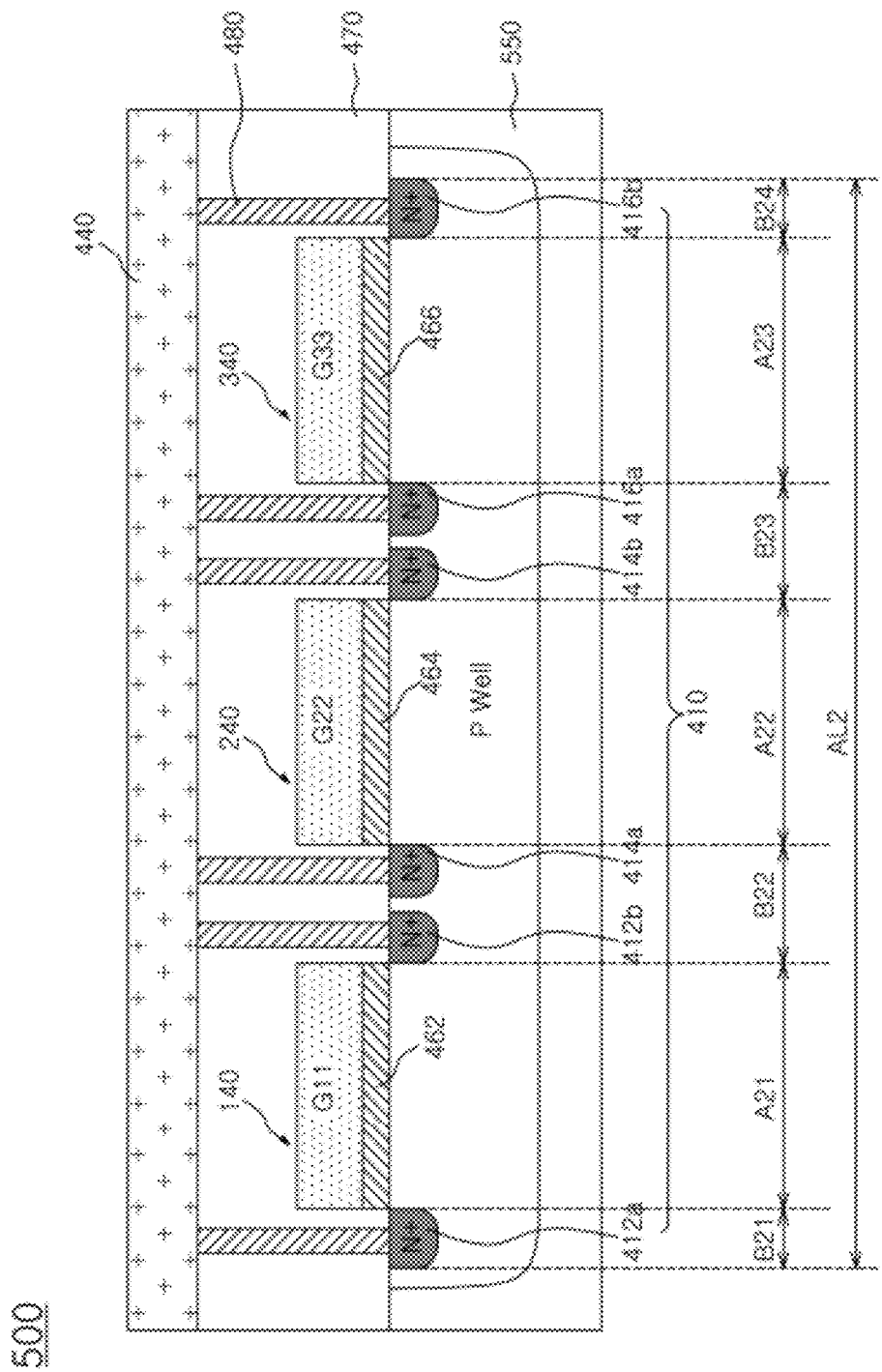
FIGS. 7 and 8 illustrate a phase change random access memory device with different variation in the source drain regions according to an embodiment of the present invention.

It should be readily understood that the second source/drain region 414 or 416 is not limited to the structure shown in FIG. 6. For example, the source drain region 414 or 416 may be separated as illustrated in FIG. 7 (see 412a, 412b and 414a, 414b).

Figure 8:
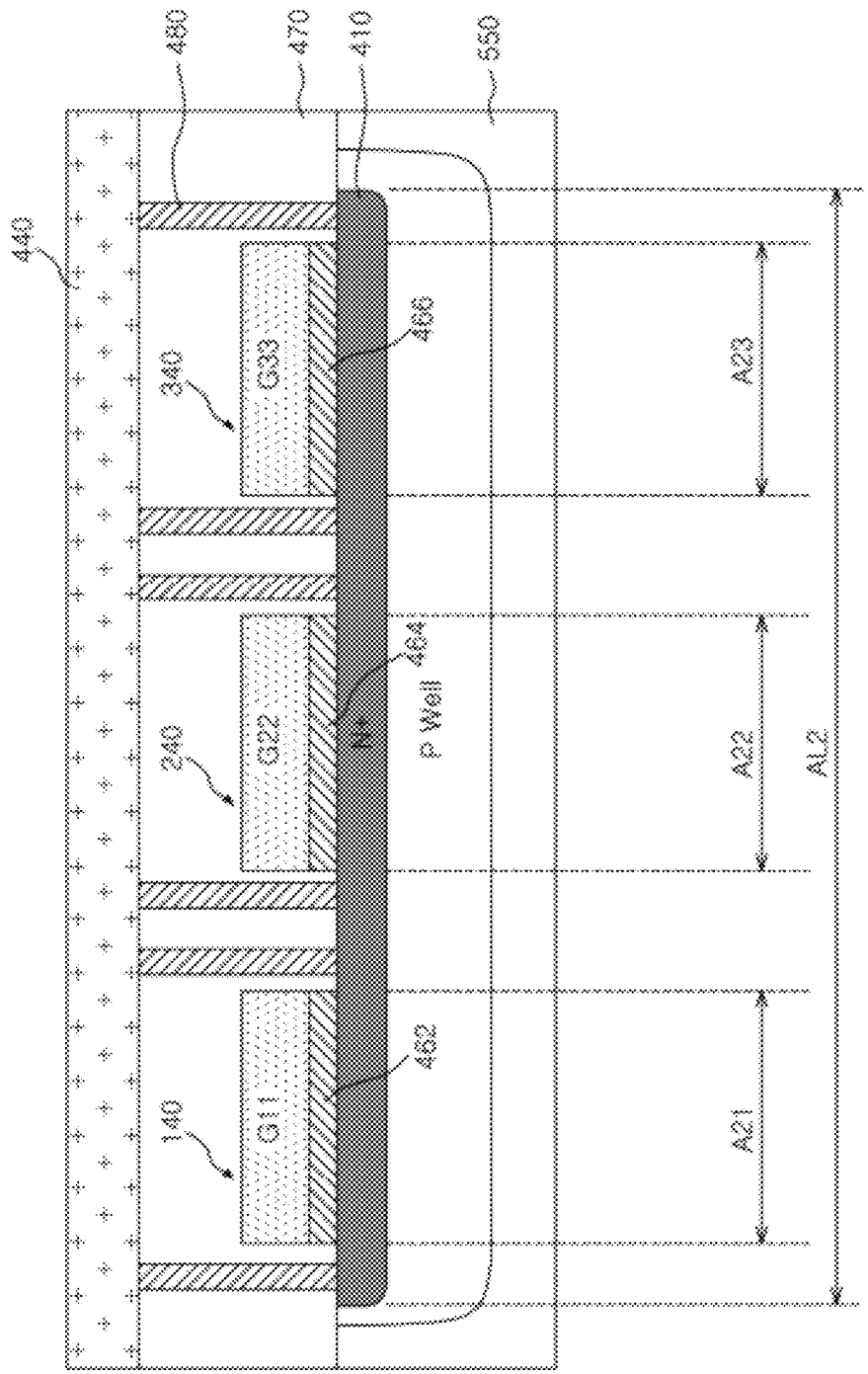

Referring to FIG. 8, the phase change random access memory according to an embodiment of the present invention may include the source/drain regions of the first to third coupling prevention units 140, 240, and 340 that are formed over one P well. Therefore, in accordance with an embodiment of the present invention, it may be possible to have one common source/drain region 410 formed as shown in FIG. 8, as well as the source/drain regions that are separately formed as shown in FIGS. 6-7.

Figure 1:
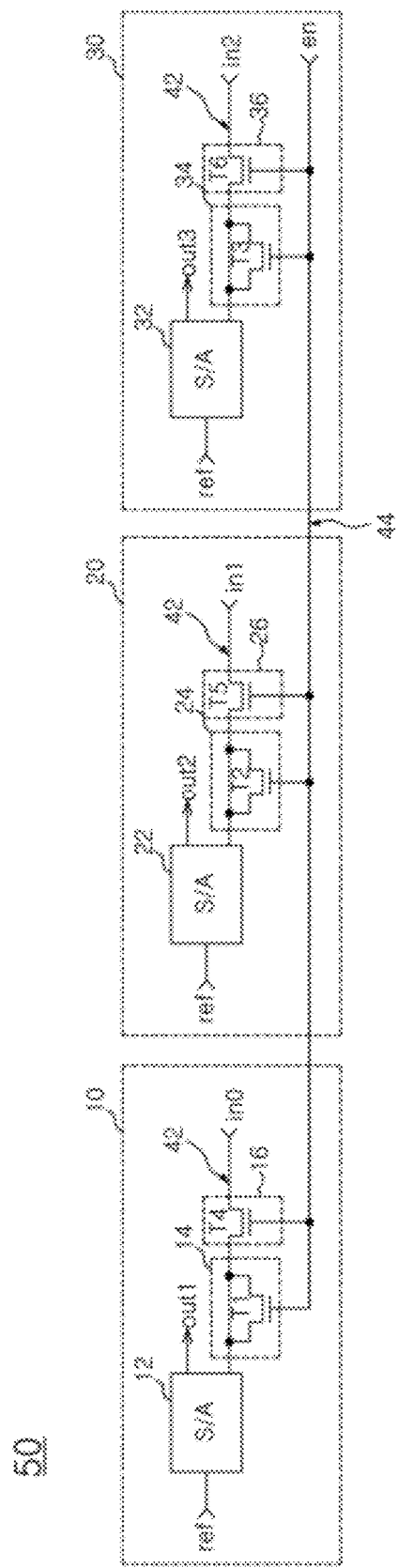
FIG. 1 is a circuit diagram of a conventional phase change random access memory device.
Figure 2:
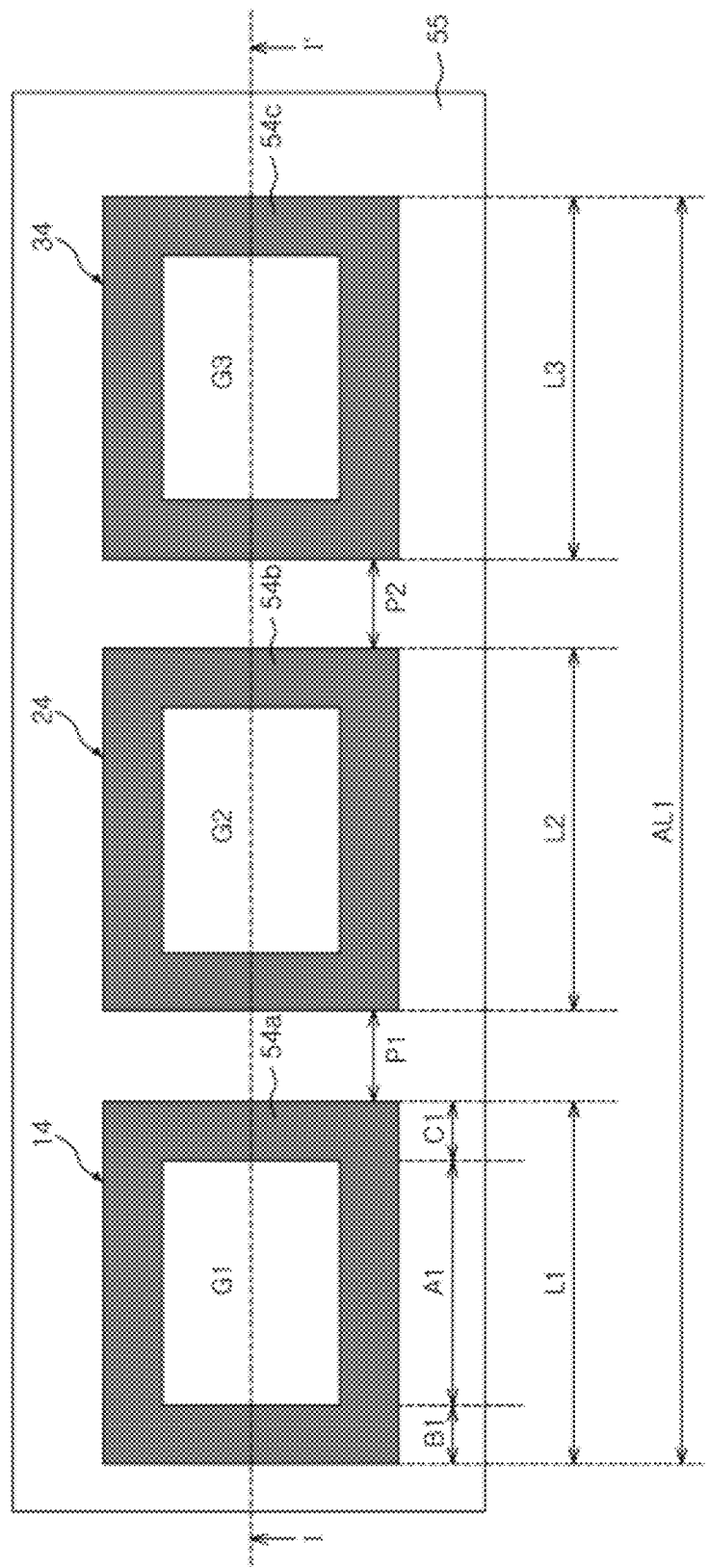
FIG. 2 is a plan view of the conventional phase change random access memory device.
Figure 3:
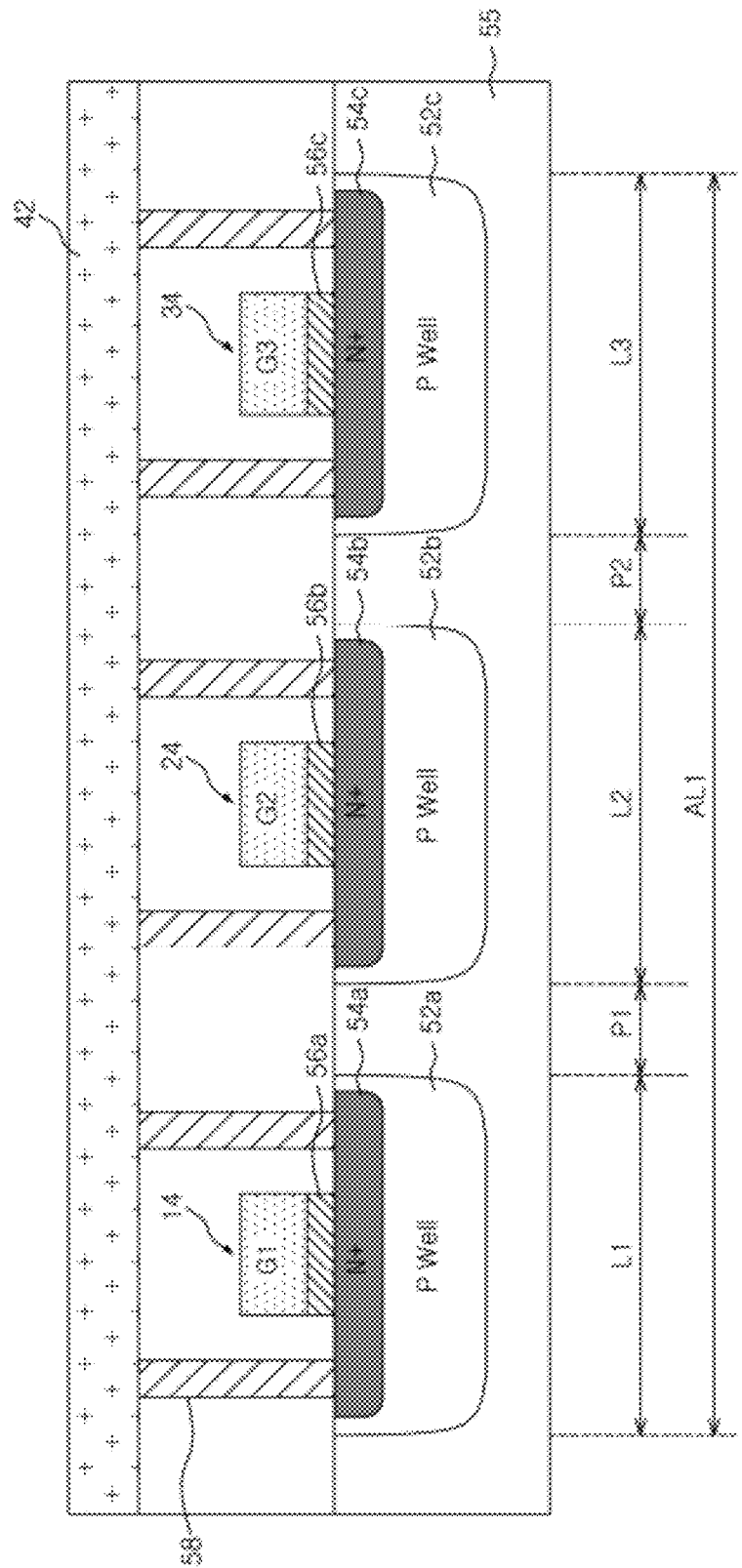
FIG. 3 is a cross-section view of the conventional phase change random access memory device, taken along a line I-I' of FIG. 2.

Referring back to FIG. 6, the total length AL2 (where AL2=A21+A22+A23+B21+B22+B23+B24) of the first to third coupling prevention units 140, 240, and 340 according to an embodiment is less than the total length AL1 of the prior art as shown in FIG. 2. That is, the total length AL2 is without the length P1+P2 of the total length AL1 of the prior art, which correspond to the barrier ribs formed between the first to third coupling prevention units 14, 24, and 34 of the first to third coupling prevention units 10, 20, 30 in the conventional phase change random access memory device. Therefore, it is possible to reduce the entire size of the phase change random access memory device.

The first to fourth source/drain regions 410 of FIG. 6 are electrically coupled to the enable signal line 440 through first to sixth contact plugs 480 formed in the respective source/drain regions.

In the conventional phase change random access memory device, the MOS capacitors T1, T2, and T3 of the respective coupling prevention units 14, 24, and 34 are electrically coupled to the input signal line 42. However, in the phase change random access memory device according to an embodiment of the present invention, the gates and the sources/drains of the first to third MOS capacitors T21, T22, and T23 of the first to third coupling prevention units 140, 240, and 340 are coupled to the enable signal line 440.

Only one MOS capacitor is formed on one well in the conventional phase change random access memory device; however, the first to fourth source/drain regions 410 of the first to third coupling prevention units 140, 240, and 340 can be formed simultaneously on one well according to an embodiment of the present invention.

Therefore, the barrier ribs that were necessary for discriminating the first to third coupling prevention units 14, 24, and 34 in the conventional phase change random access memory device are no longer needed and may be removed in an embodiment of the present invention, and it would thus be possible to reduce the size of the phase change random access memory device 500.

The embodiments of the present invention have been described on the basis of such an aspect that the regions having the barrier ribs formed therein are reduced. Without being limited thereto, however, the area obtained by removing the barrier ribs may be utilized to increase the lengths of the gates of the MOS transistors of the respective coupling prevention units, which makes it possible to further improve the coupling effect.

While certain embodiments have been described above, it will be understood to those skilled in the art that the embodiments described are by way of example only. Accordingly, the phase change random access memory device described herein should not be limited based on the described embodiments. Rather, the phase change random access memory device described herein should only be limited in light of the claims that follow when taken in conjunction with the above description and accompanying drawings.

What is claimed is:

1. A phase change random access memory device comprising:
a sense amplifier driving unit configured to compare an input signal and a reference voltage and amplify an output signal in response to the comparison result;
an input unit configured to transmit the input signal to the sense amplifier driving unit; and
a coupling prevention unit comprising a MOS transistors sharing a bulk bias, coupled between the sense amplifier driving unit and the input unit, and configured to control a sensing margin in response to a level of the input signal.

2. The phase change random access memory device according to claim 1, wherein the input unit transmits the input signal to the sense amplifier driving unit in response to an enable signal applied during a sense amplification operation.

3. The phase change random access memory device according to claim 2, wherein the gate of the MOS transistor is electrically coupled to an input signal line through which the input signal is inputted, and the source and drain of the MOS capacitors are electrically coupled to an enable signal line through which the enable signal is inputted.

4. A phase change random access memory device comprising:
a plurality of sense amplifier groups, wherein each sense amplifier group is configured to compare an input voltage and a reference voltage in response to a sense amplifier enable signal and amplify an output signal in response to the comparison result during a sense amplification operation, and wherein each sense amplifier group comprises:
a coupling prevention unit sharing a bulk bias and configured to control a sensing margin in response to the input voltage.

5. The phase change random access memory device according to claim 4, wherein the input voltages applied to the respective sense amplifier groups have different levels.

6. The phase change random access memory device according to claim 5, wherein each coupling prevention unit comprises a MOS capacitor comprising a MOS transistor.

7. The phase change random access memory device according to claim 6, wherein the MOS transistor gate of the MOS capacitor is electrically coupled to an input signal line through which the input signal is inputted.

8. The phase change random access memory device according to claim 7, wherein the MOS transistor source and drain of the MOS capacitor is electrically coupled to an enable signal line to which the enable signal is inputted to the respective sense amplifier group and share a bulk bias.

9. A phase change random access memory device comprising:
    a semiconductor substrate having an active region into which impurities are implanted;
    a plurality of transistors having source/drain regions which are commonly coupled over the one active region and arranged in a line; and
    an enable signal line electrically coupled to sources/drains of the transistors.

10. The phase change random access memory device according to claim 9, wherein each of the transistors comprises a coupling prevention unit configured to control a sensing margin during a sense amplification operation.

11. The phase change random access memory device according to claim 10, wherein the gates of the transistors are formed at even intervals over the one active region.

12. The phase change random access memory device according to claim 11, wherein the source/drain regions of the transistors are formed to fill both sides of the gates of the transistors.

13. A phase change random access memory device comprising:
    a plurality of coupling prevention units configured to control a sensing margin in response to a level of an input signal during a sense amplification operation,
    wherein the plurality of coupling prevention units are formed in a line over a semiconductor substrate having one P well, and electrically coupled to a sense amplifier enable signal line through a plurality of contact holes, respectively.

14. The phase change random access memory device according to claim 13, wherein each of the plurality of coupling prevention units comprises a MOS capacitor comprising a MOS transistor.

15. The phase change random access memory device according to claim 14, wherein the MOS transistor gates of the plurality of MOS capacitors are arranged to be spaced at even intervals from each other.

16. The phase change random access memory device according to claim 15, further comprising:
    a first source/drain region formed at one side of the gate of the first MOS capacitor;
    a plurality of middle second source/drain regions, each of which is formed between two gates of the first to the last MOS capacitors; and
    a last source/drain region formed at the other side of the gate of the last MOS capacitor.

17. The phase change random access memory device according to claim 16, wherein each of the middle source/drain regions commonly couples the drain of a MOS capacitor and the source of another MOS capacitor.

18. The phase change random access memory device according to claim 17, wherein the length of each of the first and last source/drain regions is smaller than the length of each middle source/drain region.

19. The phase change random access memory device according to claim 14, wherein the first to last coupling prevention units have one common source/drain region.

* * * * *